(12) United States Patent
Sato (10) Patent No.: US 7,095,267 B2
(45) Date of Patent: Aug. 22, 2006

(54) MOSFET DRIVE CIRCUIT, PROGRAMMABLE POWER SUPPLY AND SEMICONDUCTOR TEST APPARATUS

(75) Inventor: Nobuhiro Sato, Tokyo (JP)

(73) Assignee: Advantest Corp., Tokyo (JP)

( * ) Notice: Subject to any disclaimer, the term of this patent is extended or adjusted under 35 U.S.C. 154(b) by 37 days.

(21) Appl. No.: 10/873,937

(22) Filed: Jun. 22, 2004

(65) Prior Publication Data

US 2005/0280403 A1 Dec. 22, 2005

(51) Int. Cl.
*H03K 17/78* (2006.01)
(52) U.S. Cl. .................. 327/514; 327/427; 250/551; 250/552; 307/570; 307/311
(58) Field of Classification Search ................ 327/143, 327/261, 381, 546, 427, 514; 250/551, 214, 250/553, 552; 307/570, 311
See application file for complete search history.

(56) References Cited

U.S. PATENT DOCUMENTS 5,612,582 A * 3/1997 Shichi et al. ................ 307/130

6,803,750 B1 * 10/2004 Zhang .......................... 323/222

FOREIGN PATENT DOCUMENTS

JP      11-006860      1/1999

* cited by examiner

*Primary Examiner*—Rajnikant B. Patel
(74) *Attorney, Agent, or Firm*—Muramatsu & Associates (57) ABSTRACT

In a programmable power supply used in a semiconductor test apparatus, high-speed switching of a large current in a current rage or an output relay is enabled. In a MOSFET drive circuit 22 of a switch portion 20 provided in a programmable power supply 10 of a semiconductor test apparatus 1, a capacitor portion 22-12 is charged with electric charges by a current from a light receiving portion 22-12 of a light insulating element 22-1. When an SWA is turned on (SWB is turned off) by changeover of the analog switch portion 22-3, a gate of each MOSFET in the MOSFET portion 21 is charged with the electric charges stored in the capacitor portion 22-12, and enters an ON state. On the other hand, when the SWB of the analog switch portion 22-3 is turned on (SWA is turned off), the gate of the MOSFET is discharged.

6 Claims, 8 Drawing Sheets

(Prior Art)

MOSFET DRIVE CIRCUIT, PROGRAMMABLE POWER SUPPLY AND SEMICONDUCTOR TEST APPARATUS

BACKGROUND OF THE INVENTION

1. Field of the Invention

The present invention relates to a MOSFET (Metal Oxide Semiconductor FET (Field Effect Transistor)) drive circuit which drives a MOSFET, a programmable power supply and a semiconductor test apparatus which include this MOSFET drive circuit, and more particularly, the present invention relates to a MOSFET drive circuit which can realize high-speed switching of the MOSFET, a programmable power supply and a semiconductor test apparatus.

2. Description of the Related Art

A programmable power supply used in a semiconductor test apparatus includes a function to measure an electric current consumption of a DUT (Device Under Test) by applying a voltage to the DUT (voltage application current measurement function), a function to measure an output voltage of the DUT by flowing a current in the DUT (current supply voltage measurement function) or the like.

Such a programmable power supply can generally supply a current up to approximately 1 A, but a power supply current of a DUT varies depending on each product class and is as very wide as several-µA to 1 A. Therefore, for example, when measuring a power supply current of a DUT by using the voltage application current measurement function, a measurement range in the programmable power supply must be switched in accordance with a standard value of the power supply current of the DUT as a measurement target in order to increase the accuracy of a measurement result.

Figure 6:
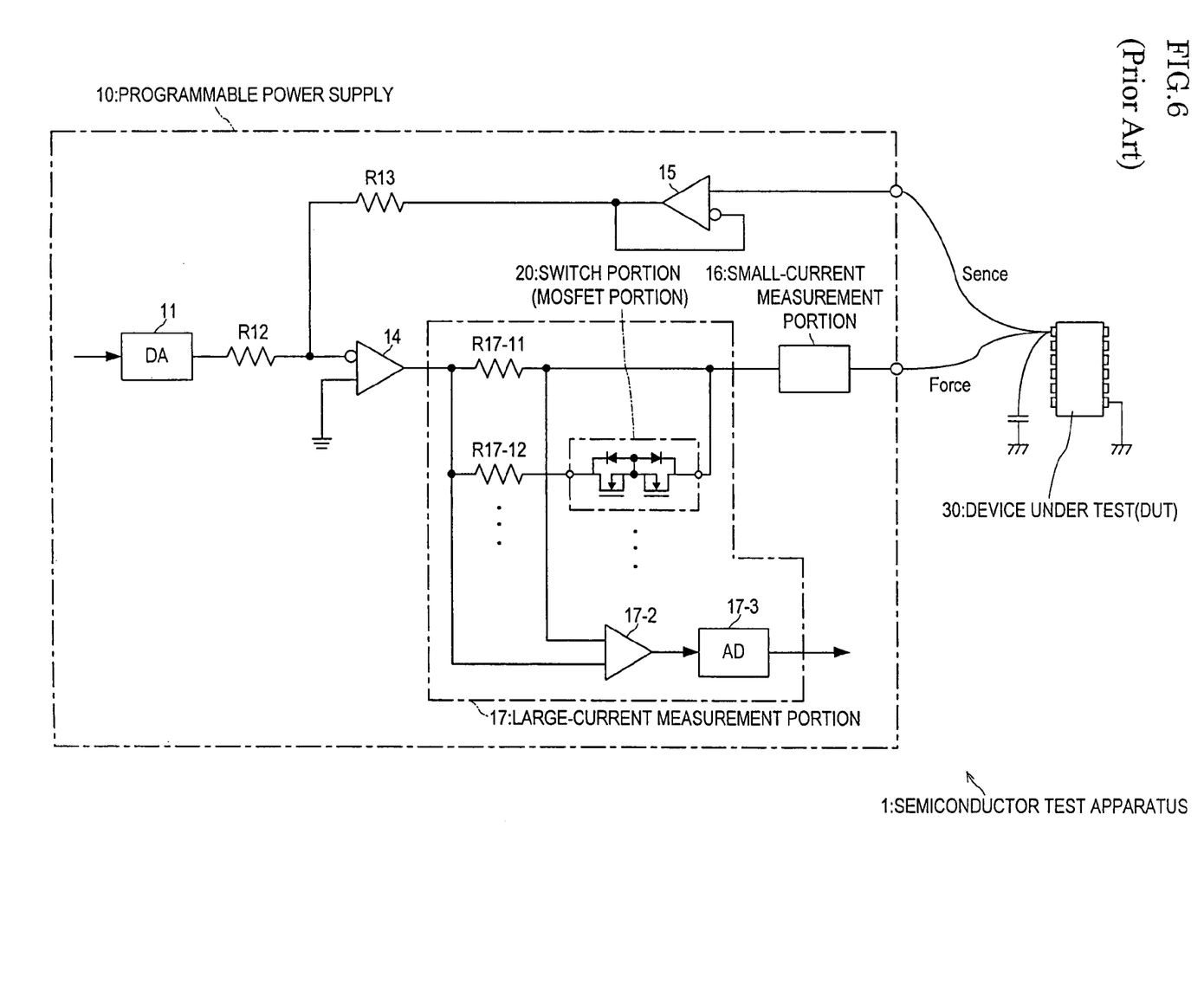
FIG. 6 is an electronic circuit diagram showing a circuit configuration of a conventional programmable power supply.

FIG. 6 shows a circuit configuration of this conventional programmable power supply.

As shown in the drawing, a programmable power supply 10 of a semiconductor test apparatus 1 includes a DA converter 11, resistors R12 and R13, a differential power amplifier 14, a buffer amplifier 15, a small-current measurement portion 16, and a large-current measurement portion 17 as main structures.

Here, the large-current measurement portion 17 is a part which measures a large current in power supply currents of a DUT 30, and has current detection resistors R17-11 to R17-1n, a potential difference detector 17-2, an AD converter 17-3 and a switch portion 20.

Of these members, the resistor R17-11 is a resistor which constantly flows there through a power supply current, and the resistors R17-12 to 17-1n are flow dividing resistors which enlarge a measurement range. These resistors R17-1 to 17-1n can use the same low resistance value Ra.

Figure 7:
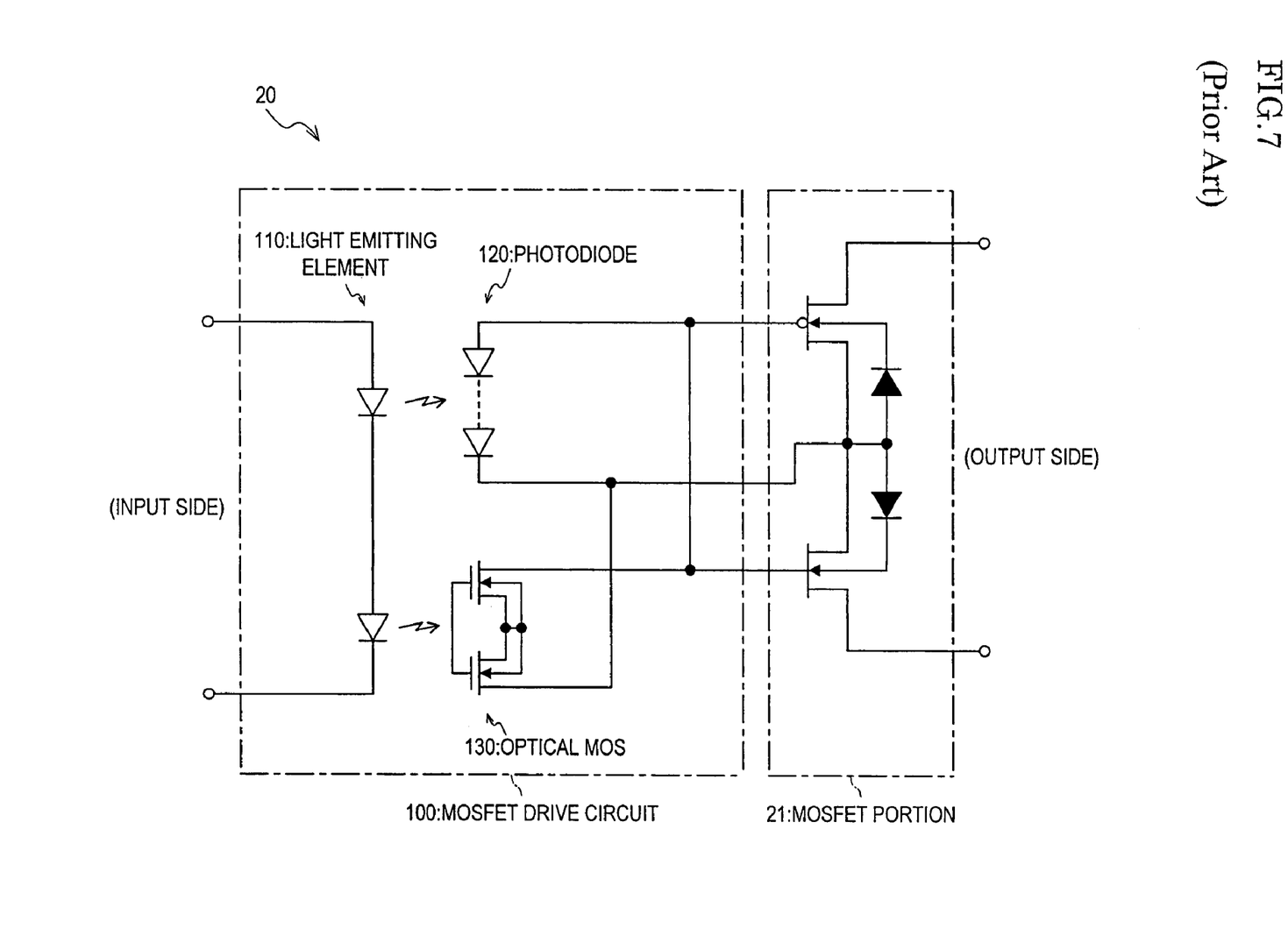
FIG. 7 is an electronic circuit diagram showing a circuit configuration of a switch portion provided in the conventional programmable power supply.

The switch portion 20 is a part which performs switching so as to supply a current to the flow dividing resistors R17-12 to R17-1n corresponding to a range which is set at the time of current measurement and, on the other hand, so as not to supply a current to the flow dividing resistors R-12 to R17-1n which do not correspond to this range. As shown in FIG. 7, the switch portion 20 has a MOSFET portion 21 and a MOSFET drive circuit 100.

The MOSFET portion 21 has a structure in which two MOSFETs form a pair. The number of the provided MOSFET portions 21 is the same as that of the flow dividing resistors R17-12 to R17-1n, and a flow dividing branch circuit is constituted by a combination of one flow dividing resistor R17 and the MOSFET portion 21 which determines whether a current is caused to flow through this resistor. Further, the plurality of flow dividing branch circuits are provided and connected with each other in parallel, thereby constituting a flow dividing circuit.

The MOSFET drive circuit 100 is a circuit which drives each MOSFET provided in the MOSFET portion 21, and has a light emitting element 110, a photodiode 120 and an optical MOS 130.

The light emitting element 110 emits light beams upon receiving an input signal from an input side.

The photodiode 120 charges a gate of the MOSFET of the MOSFET portion 21 upon receiving the light beams from the light emitting element 110. As a result, a current is caused to flow through the resistor R17 connected to that charged MOSFET, and a current based on a corresponding range can be measured.

The optical MOS 130 discharges the gate of the MOSFET of the MOSFET portion upon receiving the light beams from the light emitting element 110. As a result, a current is prevented from flowing through the resistor R17 connected to that discharged MOSFET.

It is to be noted that electrical insulation is achieved between the light emitting element 110 and the photodiode 120 and between the light emitting element 110 and the optical MOS 130.

Figure 8:
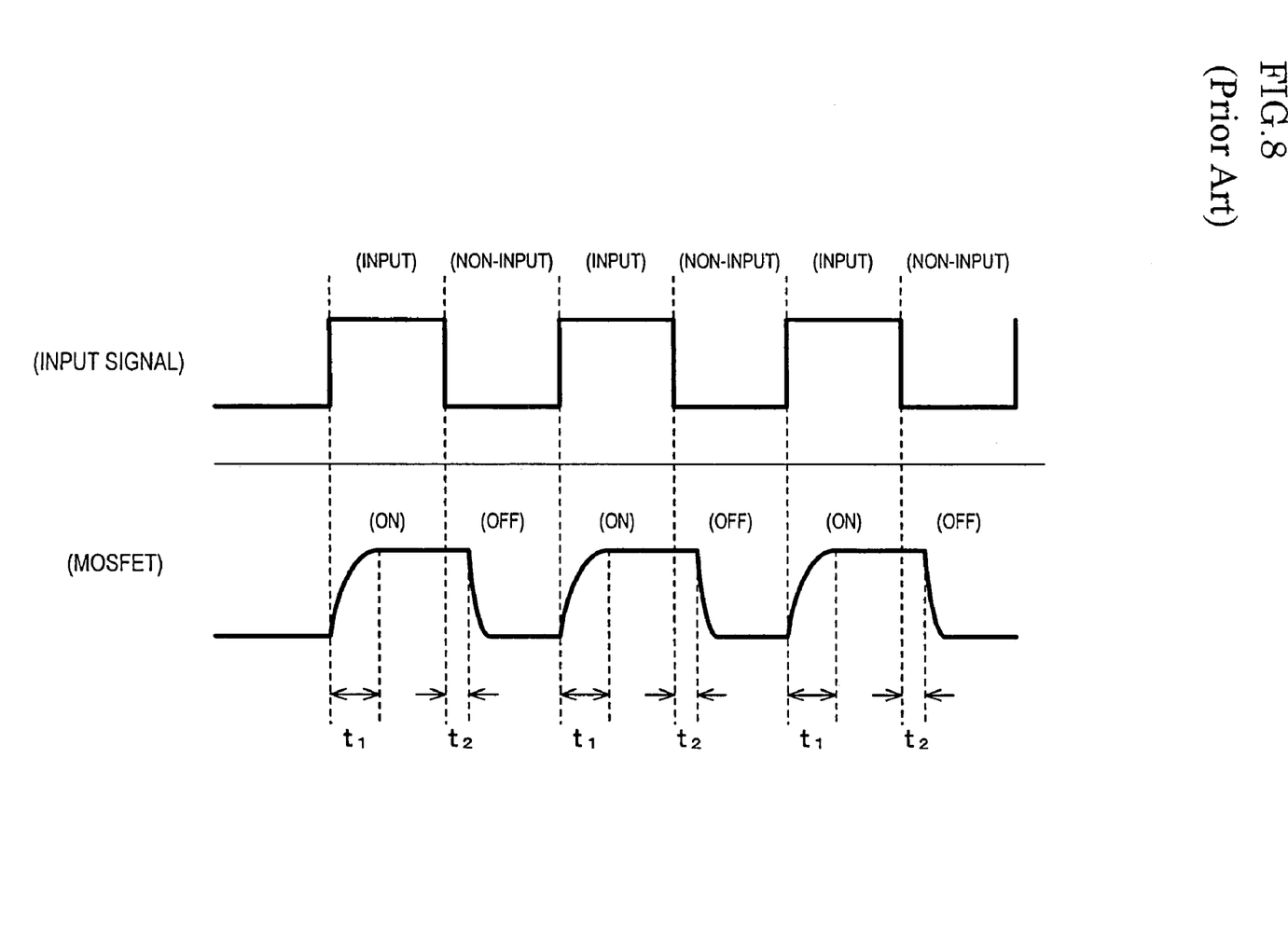
FIG. 8 is a waveform chart showing an operation of the switch portion including a conventional MOSFET drive circuit.

Furthermore, FIG. 8 shows a relationship between a signal (input signal) from the input side of the switch portion 20 and a state of the MOSFET (ON state/OFF state).

First, when the input signal is inputted, the photodiode 120 is turned on, and the optical MOSFET 130 is turned off. As a result, the gate of the MOSFET of the MOSFET portion 21 is charged and turned on.

On the other hand, when the input signal is not inputted, the photodiode 120 is turned off, and the optical MOS 130 is turned on. As a result, the gate of the MOSFET of the MOSFET portion 21 is discharged and turned off.

By switching the signal to be inputted to the input side of the switch portion 20 in this manner, ON/OFF of the MOSFET of the MOSFET portion 21 can be changed over. As a result, a current flows through the flow dividing resistors R17-12 to R17-1n connected to the MOSFET which have entered the ON state, and a current can be measured in a range corresponding to these flow dividing resistors R17-12 to R17-1n (see, e.g., patent reference 1: Japanese Patent Application Laid-open No. 11-006860).

However, in the above-described conventional programmable power supply, a time until charging the gate of the MOSFET is completed after the input signal is inputted or a response time until discharging starts after no input signal is inputted requires a considerable time.

For example, although an output current of the photodiode is used to charge the gate of the MOSFET, since this output current is relatively small, a considerable time is required until charging the MOSFET is completed ("t1" in FIG. 8).

On the other hand, although discharging the gate of the MOSFET is performed by using the optical MOS, discharging the gate of the MOSFET cannot be started before the optical MOS is charged, and hence start of discharging of the MOSFET is delayed for a time which is required to charge the optical MOS ("t2" in FIG. 8).

Specifically, the time until charging the gate of the MOSFET is completed after the input signal is inputted (t1) or the response time until discharging starts after no input signal is inputted (t2) is approximately several-ten µs to several ms.

Such a situation means that switching ON/OFF of the MOSFET is not rapidly carried out, and leads to a problem that a large current cannot be rapidly switched in a current range or an output relay in the programmable power supply or the semiconductor test apparatus.

Thus, as a solution to this problem, connecting many photodiodes can be considered.

According to this solution, since the output current is increased, a charge time of the gate of the MOSFET can be assuredly reduced.

However, connecting the photodiodes as many as the charge time can be greatly reduced increases a circuit area. Therefore, there occurs a new problem that this solution cannot contribute to a reduction in size of the programmable power supply or the like.

SUMMARY OF THE INVENTION

In view of the above-described problems, it is an object of the present invention to provide a MOSFET drive circuit which can rapidly switch a large current in a current range or the like by reducing a charge time or a discharge response time of a gate of a MOSFET and can decrease an area of a circuit which can increase the speed, and a programmable power supply and a semiconductor test apparatus incorporating the MOSFET drive circuit.

To achieve this aim, according to the present invention, there is provided a MOSFET drive circuit which drives a MOSFET, comprising a capacitor which stores electric charges for charging a gate of the MOSFET.

When such a structure is adopted for the MOSFET drive circuit, since the gate of the MOSFET can be charged by using the electric charges stored in the capacitor, a charge time can be reduced as compared with charging the gate of the MOSFET by using only the photodiode.

In particular, when the gate of the MOSFET is charged by using both an output current from the photodiode and the electric charges from the capacitor, the charge time can be further reduced.

As a result, in the programmable power supply or the semiconductor test apparatus, a large current in a current range, an output relay or the like can be switched at a high speed.

Moreover, comparing a case of reducing the charge time of the gate of the MOSFET by providing the capacitor with a case of providing many photodiodes in order to obtain the same effect, the case of providing the capacitor can further reduce a circuit area.

Therefore, this can contribute to a reduction in size of the programmable power supply or the like.

Additionally, the MOSFET drive circuit according to the present invention further comprises a first analog switch which changes over whether the gate of the MOSFET is charged by using electric charges stored in the capacitor.

When the MOSFET drive circuit has such a structure, the gate of the MOSFET can be charged with the electric charges from the capacitor by changing over the first analog switch. Thus, the charge time can be reduced.

Further, the MOSFET drive circuit according to the present invention comprises a second analog switch which changes over whether the gate of the MOSFET is discharged by short-circuiting the gate and a source of the MOSFET.

When the MOSFET drive circuit has such a structure, the gate of the MOSFET can be discharged by changing over the second analog switch. Furthermore, since this discharge is enabled by short-circuiting the gate and the source, the conventionally used optical MOS is no longer necessary. Therefore, a response time for start of the discharge in the MOSFET can be reduced.

Moreover, the MOSFET drive circuit according to the present invention further comprises a light insulating element which has a light emitting portion which emits light beams upon receiving an input signal and a light receiving portion which receives the light beams from this light emitting portion and supplies a current to the capacitor.

When such a structure is adopted for the MOSFET drive circuit, a current can be supplied to the capacitor, and electric charges can be stored in this capacitor.

Additionally, when a photodiode is used for the light receiving portion of the light insulating element and the gate of the MOSFET is charged by using an output current from this photodiode and electric charges from the capacitor, a charge time can be greatly reduced as compared with a case of charging by using only the output current from the photodiode.

Further, the MOSFET drive circuit according to the present invention comprises a charge auxiliary circuit which subserves charging of the capacitor.

When the MOSFET drive circuit has a such a structure, it is possible to avoid a situation in which a voltage drop in the capacitor cannot be ignored by repeatedly switching ON/OFF of the MOSFET.

Furthermore, according to the present invention, there is provided a MOSFET drive circuit which drives a MOSFET, comprising an analog switch which changes over whether a gate of the MOSFET is discharged by short-circuiting the gate and a source of the MOSFET.

When the MOSFET drive circuit has such a structure, the gate of the MOSFET can be discharged by changing over the analog switch. Moreover, since the discharge is realized by short-circuiting the gate and the source, the conventional optical MOS is no longer necessary. Therefore, a response time for start of the discharge in the MOSFET can be reduced.

Additionally, according to the present invention, there is provided a programmable power supply which can measure a current flowing through a load as a target of power supply and switch a range according to a value of the current, comprising: a flow dividing circuit which comprises in accordance with each range one or more flow dividing branch circuits each of which includes a resistor and a MOSFET, the respective flow dividing branch circuits being connected with each other in parallel; and a MOSFET drive circuit which individually drives the MOSFETs of the flow dividing circuit, wherein the MOSFET drive circuit comprises the MOSFET drive circuit defined in the appended claims.

When the programmable power supply has a such a structure, the MOSFETs of the flow dividing circuit can be switched at a high speed in accordance with a set range in case of measuring a large current flowing through a load (e.g., a device under test) as a target of power supply.

For example, in case of turning on the MOSFET, since a gate thereof is charged with electric charges from a capacitor, its charge time can be reduced as compared with a case of charging by using only an output current from a photodiode.

On the other hand, in case of turning off the MOSFET, since a gate thereof is discharged by changeover of the analog switch, a response time until start of the discharge can be reduced as compared with a case of discharging by using an optical MOS.

Therefore, in the programmable power supply, a large current in a current range or the like can be switched at a high speed.

Further, according to the present invention, there is provided a semiconductor test apparatus comprising a programmable power supply which supplies a power to a device under test and measures a current flowing through the device under test, wherein the programmable power supply comprises the programmable power supply defined in the appended claim.

When such a structure is adopted for the semiconductor test apparatus, a large current in a current range or the like can be switched at a high speed in this semiconductor test apparatus.

According to the present invention, since the gate of the MOSFET is charged by using electric charges from the capacitor and the gate of the MOSFET is discharged by changeover of the analog switch, a time from start of the charge to end of the same or a response time until the discharge starts can be reduced.

As a result, in the programmable power supply or the semiconductor test apparatus, a large current in a current range or the like can be switched at a high speed.

DETAILED DESCRIPTION OF THE PREFERRED EMBODIMENTS

Preferred embodiments of a MOSFET drive circuit, a programmable power supply and a semiconductor test apparatus according to the present invention will now be described hereinafter with reference to the accompanying drawings.

Figure 1:
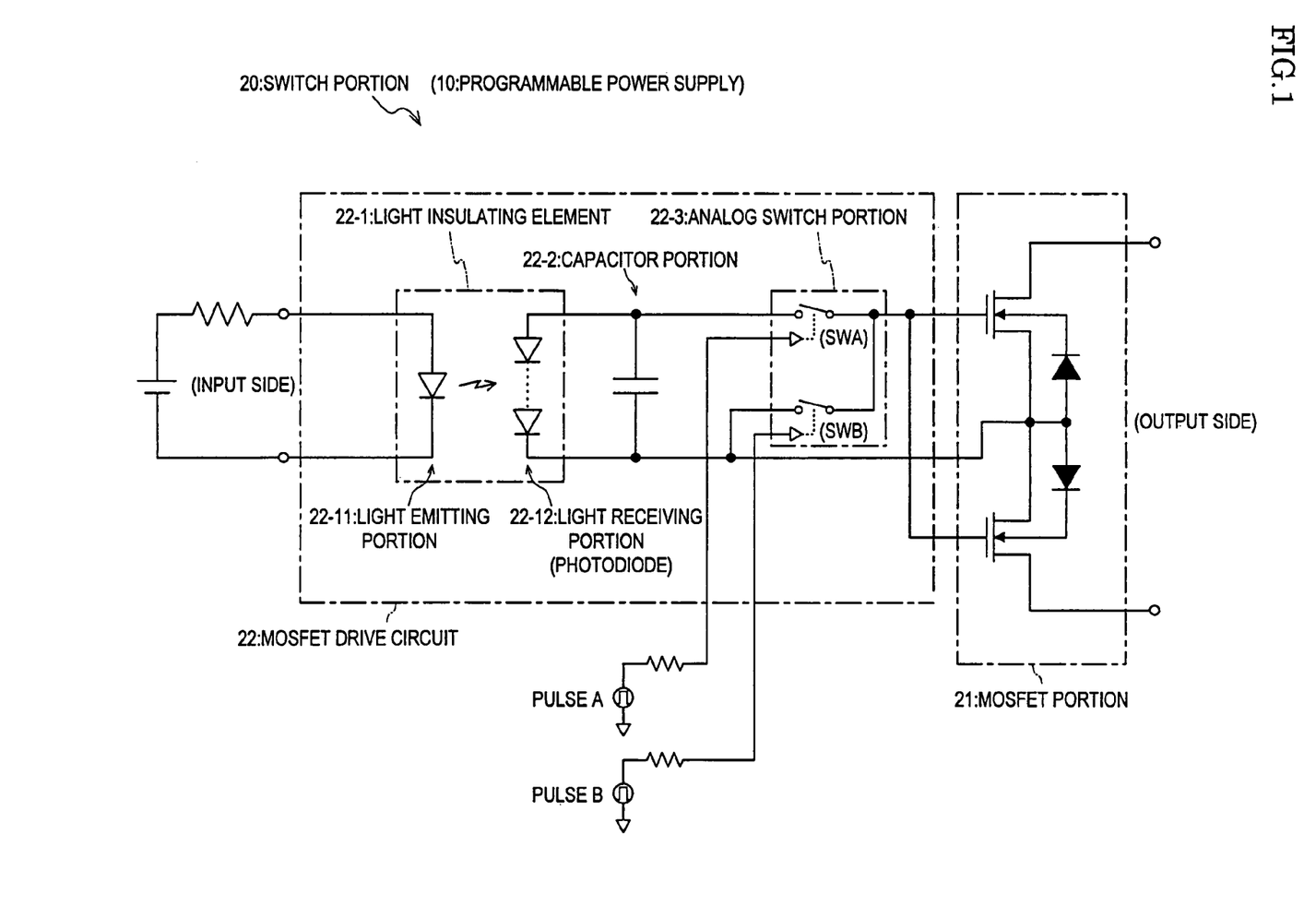
FIG. 1 is a electronic circuit diagram showing a structure of a switch portion including a MOSFET drive circuit according to the present invention.

A description will be first given as to circuit configurations of the MOSFET drive circuit, the programmable power supply and the semiconductor test apparatus which have this drive circuit according to the present invention with reference to FIG. 1.

This drawing is an electronic circuit diagram showing a circuit configuration of a switch portion included in the programmable power supply according to this embodiment.

A switch portion 20 shown in FIG. 1 is a switch portion 20 included in the same programmable power supply 10 as the prior art depicted in FIG. 6, and it comprises a DA converter 11, resistors R12 and R13, a differential power amplifier 14, a buffer amplifier 15, a small-current measurement portion 16 and a large-current measurement portion 17 as main structures of the programmable power supply 10 including this switch portion 20 as shown in FIG. 6.

Further, the large-current measurement portion 17 has current detection resistors R17-11 to R17-1n, a potential difference detector 17-2, an AD converter 17-3 and the switch portion 20.

Here, the switch portion 20 has a MOSFET portion 21 and a MOSFET drive circuit 22 as shown in FIG. 1.

The MOSFET drive circuit 22 has a light insulating element 22-1, a capacitor portion 22-2 and an analog switch portion 22-3 as shown in the drawing.

The light insulating element 22-1 can be constituted of, e.g., a photo-coupler, and has a light emitting portion 22-11 (e.g., a light emitting diode) and a light receiving portion 22-12 (e.g., a photodiode). Electrical insulation is achieved between the light emitting portion 22-11 and the light receiving portion 22-12.

A power supply is connected to the light emitting portion 22-11 (i.e., an input side) of this light insulating element 22-1. As a result, the light emitting portion 22-11 can emit light beams, and the light receiving portion 22-12 produces a current, thereby storing electric charges in the capacitor portion 22-2.

It is to be noted that the light emitting diode or the photodiode is used as the light insulating element 22-1 in this embodiment, the light insulating element 22-1 is not restricted to the light emitting diode or the like, and a a is solar battery or the like can be used, for example.

The capacitor portion 22-2 stores electric charges by using a current from the light receiving portion 22-12 of the light insulating element 22-1. The stored electric charges are used to charge a gate of each MOSFET of the MOSFET portion 21.

It is to be noted that a voltage drop cannot be ignored in the capacitor portion 22-1 by repeatedly operating the MOSFET.

Figure 2:
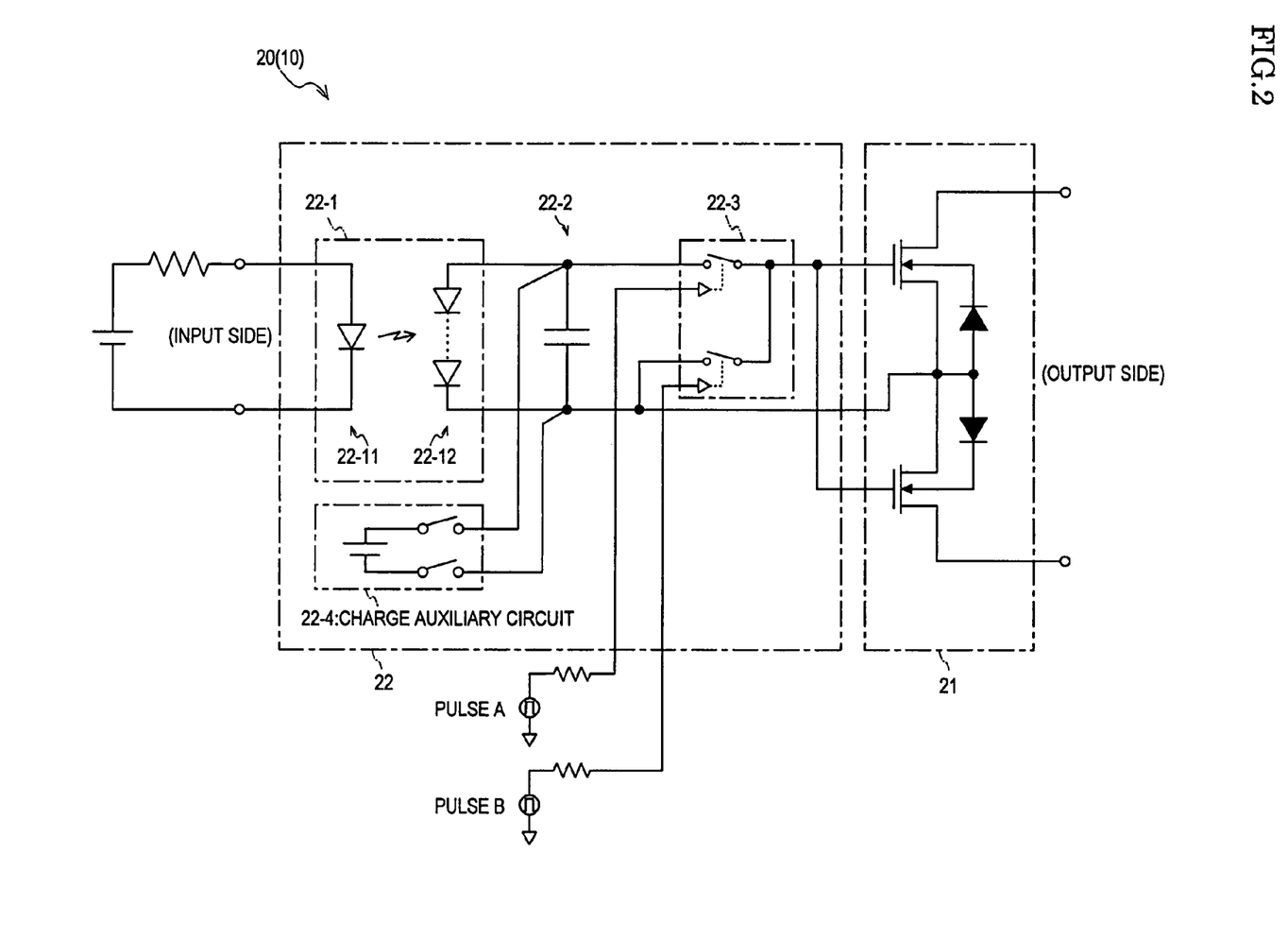
FIG. 2 is an electronic circuit diagram showing another structure of the switch portion including the MOSFET drive circuit according to the present invention.

Thus, as shown in FIG. 2, a circuit which subserves charging in the capacitor portion 22-1 (charge auxiliary circuit 22-4) can be connected according to needs. As a result, it is possible to avoid a situation in which a voltage drop in the capacitor cannot be ignored.

This charge auxiliary circuit 22-4 can be constituted of a power supply, a switch or the like.

The analog switch portion 22-3 is an electronic switch circuit which uses an FET, a diode or the like inside as a switch element, and can process analog signals.

As shown in FIG. 1, the analog switch portion 22-3 has a switch A (SWA, a first analog switch) which supplies electric charges in the capacitor portion 22-2 to each MOSFET of the MOSFET portion 21 and charges a gate of the MOSFET, and a switch B (SWB, a second analog switch) which discharges the electric charges of the gate of each MOSFET of the MOSFET portion 21.

That is, when the SWA is turned on (SWB is turned off), the gate of the MOSFET is charged with the electric charges stored in the capacitor portion 22-2, and this MOSFET is turned on. On the other hand, when the SWB is turned on (SWA is turned off), since the gate electric charges of the MOSFET are discharged, this MOSFET is turned off.

It is to be noted that the gate and a source of the MOSFET are short-circuited when the SWB is turned on. As a result, the gate electric charges of the MOSFET can be discharged.

Figure 3:
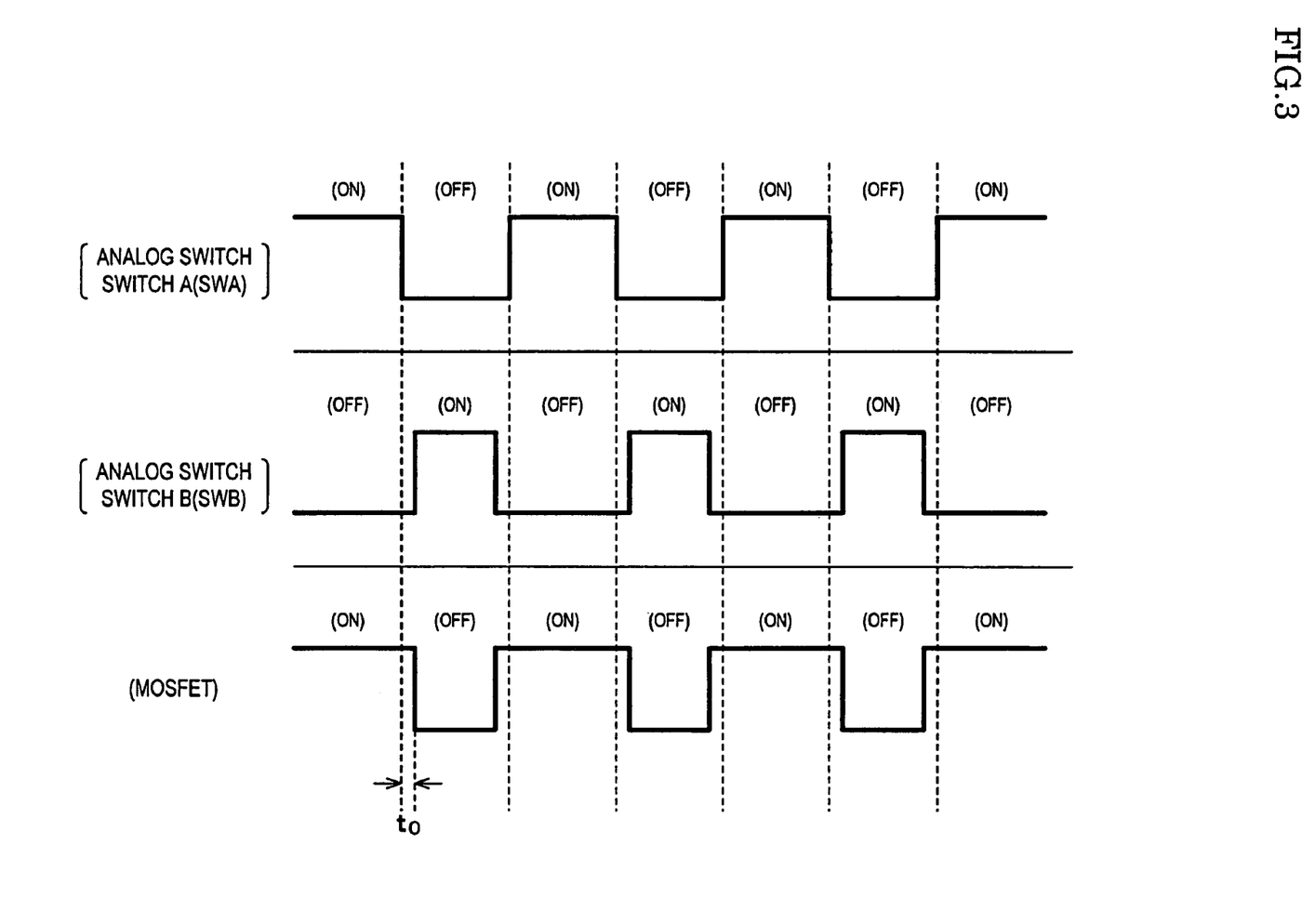
FIG. 3 is a waveform chart showing an operation of the switch portion including the MOSFET drive circuit according to the present invention.

FIG. 3 shows how each analog switch in such an analog switch portion 22-3 is changed over and how the MOSFET is thereby switched.

As shown in the drawing, for example, when the SWA is "ON" and the SWB is "OFF" in the analog switch portion 22-3, the gate of the MOSFET is charged and enters the "ON" state.

On the contrary, when the SWA is switched to "OFF" and the SWB is switched to "ON", the gate of the MOSFET is discharged, and this MOSFET enters the "OFF" state.

That is, in order to turn "ON" the MOSFET, the SWA is turned "ON" and the SWB is turned "OFF". On the other hand, in order to turn "OFF" the MOSFET, the SWA is turned "OFF" and the SWB is turned "ON".

A control over switching of the SWA and the SWB in this analog switch portion 22-3 is carried out by using pulse waves (analog control signal) from a current setting circuit (not shown).

The current setting circuit is a constituent part which determines a range of a current measured by the programmable power supply 10.

The analog control signal has a pulse A which controls the SWA in the analog switch portion 22-3 and a pulse B which controls the SWB in the same.

For example, when the pulse A indicative of "ON" is supplied, the SWA is turned "ON". When the pulse A indicative of "OFF" is supplied, the SWA is turned "OFF". Likewise, when the pulse B indicative of "ON" is supplied, the SWB is turned "ON". When the pulse B indicative of "OFF" is supplied, the SWB is turned "OFF".

Figure 4:
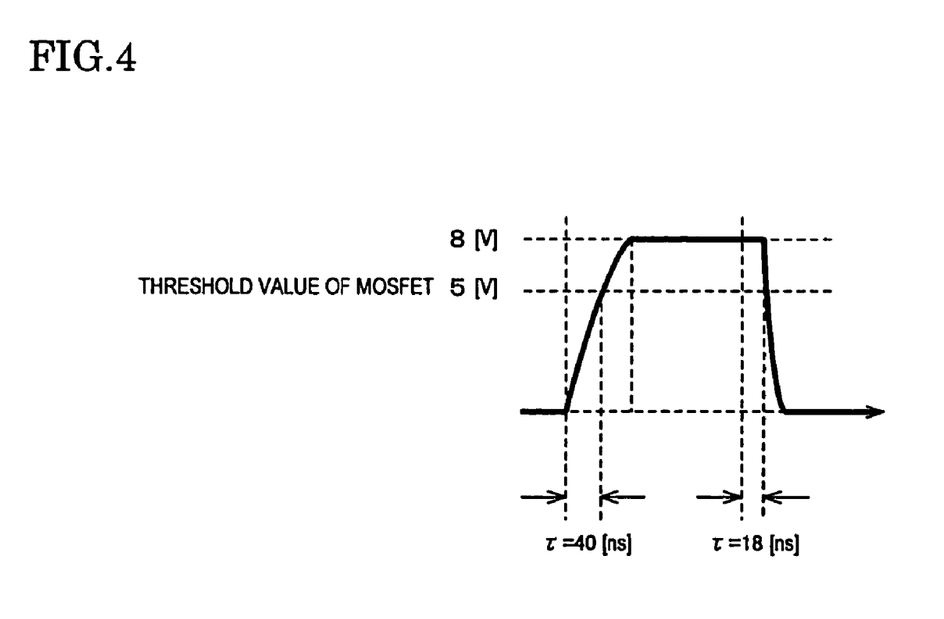
FIG. 4 is a waveform chart illustrating a charge time and a discharge response time of a MOSFET when using the MOSFET drive circuit according to the present invention.

A description will now be given as to a charge time and a discharge response time of the gate of the MOSFET when the MOSFET drive circuit according to the present invention is used with reference to FIG. 4.

It is assumed that Vc is a voltage charged in the capacitor portion 22-2 by the light receiving portion 22-12 (photodiode) of the light insulating element 22-1. Further, it is assumed that ron is a resistance when the SWA and the SWB in the analog switch portion 22-3 are ON, Furthermore, it is assumed that Ciss is a capacitance between the gate and the source of each MOSFET of the MOSFET portion 21. However, it is determined that C (capacitance of the capacitor portion 22-2)>>Ciss is achieved.

The voltage (Vgs) between the gate and the source of each MOSFET can be obtained based on a formula of a transient response from the following expression:

$$Vgs = Vc \times \{1 - \exp(-t/\tau)\} \quad \text{(Expression 1)}$$

Here, a time constant τ based on the ON resistance ron of the analog switch portion 22-3 and the capacitance Ciss between the gate and the source of each MOSFET is represented by the following expression:

$$\tau = ron \times 2 \times Ciss \quad \text{(Expression 2).}$$

Moreover, assuming that Vth is a threshold value of the MOSFET, the MOSFET is turned "ON" with the time ton by which Vgs>Vth is achieved, and the MOSFET is turned "OFF" with the time toff by which Vgs<Vth is achieved.

However, it is assumed that the capacitor portion C is sufficiently larger than the capacitance Ciss between the gate and the source of the MOSFET.

Concrete numeric values will now be given by using the expressions 1 and 2.

For example, assuming that the resistance ron is 20 [Ω] when the SWA and the SWB in the analog switch portion 22-3 are ON and the capacitance Ciss between the gate and the source of the MOSFET is 1000 [pF], the time constant τ can be obtained as follows by using the expression 2:

$$\tau = 20 \times 2 \times 1000 \times 10^{-12} = 40 \times 10^{-9} \rightarrow 40 \text{ [ns]} \quad \text{(Expression 3)}$$

Additionally, assuming that an output voltage of the photodiode in the light insulating element 22-1 is 8 [V] and the threshold value of the MOSFET is 5 [V], 5÷8=0.625 is achieved.

As a result, the charge time of the gate of the MOSFET is 40 [ns] and the discharge response time of the same is 18 [ns]. The charge time and the discharge response time are much shorter than the respective times in the prior art (approximately from several-10 μs to several ms)

Although the preferred embodiments of the MOSFET drive circuit, the programmable power supply and the semiconductor test apparatus according to the present invention have been described, the MOSFET drive circuit, the programmable power supply an the semiconductor test apparatus according to the present invention are not restricted to the foregoing embodiments, and it is needles to say that various modifications can be carried out within the scope of the present invention.

Figure 5:
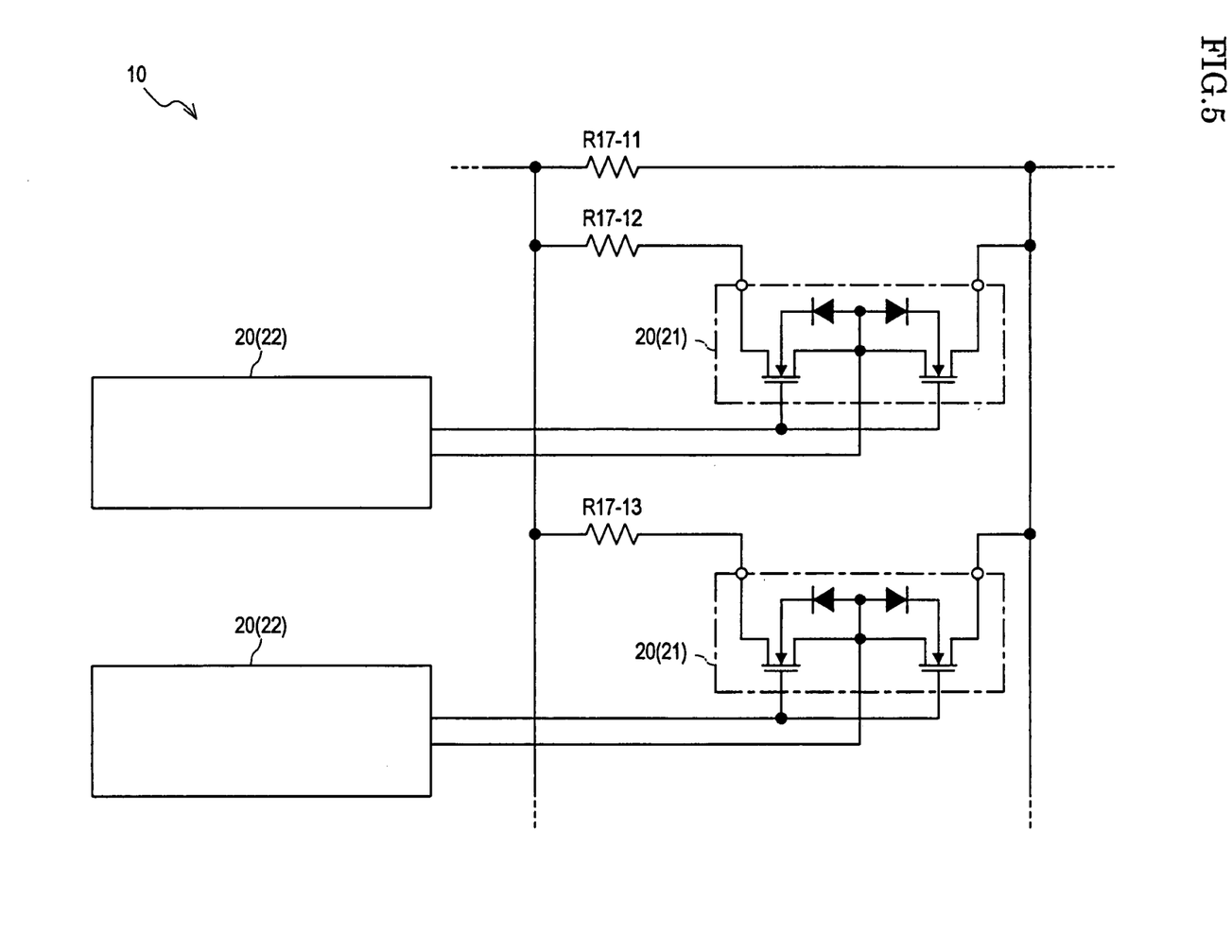
FIG. 5 is an electronic circuit diagram showing a circuit configuration of a programmable power supply in which a plurality of flow dividing branch circuits are provided.

For example, although the description has been given as to only one switch portion included in the programmable power supply in the foregoing embodiments, a plurality of flow dividing resistors have been conventionally provided in the programmable power supply, and a plurality of switch portions constituting a flow dividing circuit are provided with these flow dividing resistors. Therefore, as shown in FIG. 5, in the programmable power supply 10 or the semiconductor test apparatus 1 having this power supply, the plurality of switch portions 20 each including the MOSFET drive circuit 22 according to the present invention can be provided.

Since the present invention is an invention which is used to drive the MOSFET at a high speed, it can be utilized in an apparatus or the like which uses the MOSFET.

What is claimed is:

1. A MOSFET drive circuit which drives a MOSFET, comprising:
   a capacitor which stores electric charges for charging a gate of the MOSFET;
   a first analog switch which changes over whether the gate of the MOSFET is charged with the electric charges stored in the capacitor; and
   a second analog switch which changes over whether the gate of the MOSFET is discharged by short-circuiting the gate and a source of the MOSFET.

2. The MOSFET drive circuit according to claim 1, further comprising:
   a light insulating element having a light receiving portion which emits light beams upon receiving an input signal, and
   a light receiving portion which supplies a current to the capacitor upon receiving the light beams from the light emitting portion.

3. The MOSFET drive circuit according to claim 1, further comprising a charge auxiliary circuit which subserves charging of the capacitor.

4. A MOSFET drive circuit which drives a MOSFET, comprising:
   an analog switch which changes over whether a gate of the MOSFET is discharged by short-circuiting the gate and a source of the MOSFET.

5. A programmable power supply which can measure a current flowing through a load as a power supply target and switch a range according to a value of the current, comprising:
- a flow dividing circuit which comprises in accordance with the range one or more flow dividing branch circuits each of which includes a resistor and a MOSFET, the respective flow dividing branch circuits being connected with each other in parallel; and
- a MOSFET drive circuit which individually drives the MOSFETs included in the flow dividing circuit,
- wherein the MOSFET drive circuit comprises the MOSFET drive circuit which is comprised of:
  - a capacitor which stores electric charges for charging a gate of the MOSFET;
  - a first analog switch which changes over whether the gate of the MOSFET is charged with the electric charges stored in the capacitor; and
  - a second analog switch which changes over whether the gate of the MOSFET is discharged by short-circuiting the gate and a source of the MOSFET.

6. A semiconductor test apparatus comprising:
a programmable power supply which supplies a power to a device under test and measures a current flowing through the device under test, wherein the programmable power supply comprises:
- a flow dividing circuit which comprises in accordance with the range one or more flow dividing branch circuits each of which includes a resistor and a MOSFET, the respective flow dividing branch circuits being connected with each other in parallel; and
- a MOSFET drive circuit which individually drives the MOSFETs included in the flow dividing circuit,
- wherein the MOSFET drive circuit comprises the MOSFET drive circuit which is comprised of:
  - a capacitor which stores electric charges for charging a gate of the MOSFET;
  - a first analog switch which changes over whether the gate of the MOSFET is charged with the electric charges stored in the capacitor; and
  - a second analog switch which changes over whether the gate of the MOSFET is discharged by short-circuiting the gate and a source of the MOSFET.

* * * * *